United States Patent [19]
Le et al.

[11] Patent Number: 5,686,208
[45] Date of Patent: Nov. 11, 1997

[54] PROCESS FOR GENERATING A PHASE LEVEL OF AN ALTERNATING APERTURE PHASE SHIFTING MASK

[75] Inventors: Chin Le; Christophe Pierrat, both of Boise, Id.

[73] Assignee: Micron Technology, Inc., Boise, Id.

[21] Appl. No.: 567,007

[22] Filed: Dec. 4, 1995

[51] Int. Cl.[6] .................................................. G03F 9/00
[52] U.S. Cl. ............................... 430/5; 430/322; 430/324
[58] Field of Search ............................ 430/5, 322, 324, 430/312, 315

[56] References Cited

U.S. PATENT DOCUMENTS

| | | | |
|---|---|---|---|
| 5,308,722 | 5/1994 | Nistler | 430/5 |
| 5,308,741 | 5/1994 | Kemp | 430/5 |
| 5,403,682 | 4/1995 | Lin | 430/5 |

FOREIGN PATENT DOCUMENTS 2-140743  5/1990  Japan .

Primary Examiner—S. Rosasco
Attorney, Agent, or Firm—Arnold, White & Durkee

[57] ABSTRACT

A process for generating the phase level pattern of an alternating aperture phase shifting mask is provided. All polygons having both X and Y dimensions greater than a predetermined value are removed from the chrome level design of a mask to create a pattern L1. A rectangle is then created along the edge of each polygon in pattern L1 if the edge is greater than the predetermined value. These rectangles, which form a pattern L2, are then merged with pattern L1 to form pattern L3. A pattern, L4, is created within pattern L3 beginning at each edge of pattern L1 having a width less than or equal to the predetermined width. These rectangles extend from the corresponding edge to the opposite side of pattern L3. Pattern L5 is created by subtracting overlapping portions of pattern L4 from pattern L2. Each polygon of pattern L5 is assigned a phase of 0° or 180° with adjacent polygons having opposite phases. Pattern L6 is created by removing all polygons having a phase of 0° from pattern L5. Pattern L6 corresponds to the phase shifting level.

8 Claims, 4 Drawing Sheets

PROCESS FOR GENERATING A PHASE LEVEL OF AN ALTERNATING APERTURE PHASE SHIFTING MASK

This invention was made with government support under Contract No. MDA 972-92-C-0054 awarded by Advanced Research Projects Agency (ARPA). The government has certain rights in this invention.

BACKGROUND

The present invention relates to processes for creating photomasks or reticles used in the fabrication of semiconductor devices. More particularly, the present invention relates to processes for generating the patterns used to fabricate phase shifting masks.

Advances in capacity in semiconductor chips have generally been the result of decreases in the size of the features on the chip. The lateral dimensions of features are generally defined by photolithographic techniques in which a detailed pattern is transferred to a photoresist by shining light through a mask or reticle.

In recent years, phase shifting masks have been developed to improve photolithographic processes. Phase shifting masks increase image contrast and resolution without reducing wave length or increasing numerical aperture. These masks also improve depth of focus and process latitude for a given feature size.

With phase shift photolithography, the interference of light rays is used to overcome the problems of diffraction and improve the resolution and depth of optical images projected onto a target. With this technology, the phase of the exposure light at the target is controlled such that adjacent bright areas are preferably formed 180 degrees out of phase with each other. Dark regions are thus produced between the bright areas by destructive interference even when diffraction would otherwise cause these areas to be lit. This technique improves total resolution at the target.

In general, a phase shifting mask is constructed with a repetitive pattern formed of three distinct layers of material. An opaque layer provides areas that allow no light transmission. A first transparent layer provides areas which allow close to 100% of the light to pass through. A transparent phase shifting layer provides areas which allow close to 100% of the light to pass through but phase shifted 180 degrees from the light passing through the first transparent layer. The first transparent layer and the phase shifting layer are positioned such that light rays diffracted through each area are cancelled out in a darkened area between them. This creates a pattern of dark and bright areas which can be used to clearly delineate features of a pattern defined by the opaque layer on the semiconductor wafer. Another method of constructing a phase shifting mask utilizes a semitransparent layer to cause the phase shift.

One process for fabricating phase shifting masks is disclosed in U.S. Pat. No. 5,308,722 which uses a voting technique to fabricate a defect-free printing mask. The disclosed process includes forming an opaque layer on a major surface of a transparent substrate, patterning the opaque layer to expose portions of the underlying transparent substrate, forming a phase shifting mask layer to expose the potions of the underlying transparent substrate, phase-etching partway into the exposed portions of the transparent substrate by an mount equivalent to a preselected phase shift angle, and voting the phase shifting mask layer to accomplish the phase-etching in a series of steps, each equal to the phase shift angle, until a full 180° phase shift is accomplished. The number of phase-etching steps claimed in the patent is from three to five.

Other processes of fabricating phase shifting masks are disclosed in Japanese Patent Application No. 63-2950. This application discloses processes in which a transparent film is formed over a portion of a mask to create a phase shift as well as the etching of phase shifting channels into the mask substrate.

One of the problems associated with the fabrication of phase shifting masks is the formation of defects in the mask which are then transferred to the semiconductor device. Defects in phase shifting masks are more critical than similar sized defects in standard chrome masks. The benefit of greater contrast that is achieved with phase shifting masks also causes defects to be more noticeable. Additionally, detecting and correcting defects in phase shifting masks is much harder.

Another difficulty associated with the fabrication of phase shifting masks is in generating the design of the phase shifting level. Additional patterns have to be designed to define the phase shifting areas. This process is especially difficult with random layouts on the mask which increase the complexity of design process.

Accordingly, it would be a significant advancement in the art to provide a process for generating the phase level of a phase shifting mask which is simple to perform. Such a process is disclosed and claimed herein.

SUMMARY OF THE INVENTION

The present invention provides a novel process for generating the patterns used to fabricate the phase level of an alternating aperture phase shifting mask. First, a layer is generated by copying the chrome level pattern of the phase shifting mask and removing all polygons from the pattern that have both X and Y dimensions larger than a predetermined width W1. Predetermined width W1 is established by the designer and is a function of the exposure conditions that will be used with the mark. Polygons with X and Y dimensions greater than W1 are large enough that they do not require any phase shifting technique to improve their printability. The resulting pattern is defined as L1.

A second pattern defined as L2 is generated by creating a rectangle along the edge of each polygon of L1 if the edge is longer than W1. The length of the rectangle is equal to the length of the edge of the polygon and the width is chosen to be equal to a predetermined width of W2. Predetermined width W2 is established by the designer and must be large enough to generate a phase shift. It is a function of the light source that will be used and the exposure conditions.

The pattern L1 is merged with the pattern L2 to form a pattern defined as L3. Portions of the patterns may be overlapping.

A plurality of rectangles are next created beginning at each edge of the pattern L1 having a width less than or equal to W1. The rectangles have a width equal to the corresponding edge and a length extending to an opposite side of the pattern L3. This group of rectangles form a pattern defined as L4.

A new pattern defined as L5 is formed by subtracting overlapping portions of pattern L4 from the pattern L2. Each polygon of L5 is then assigned a phase of 0° or 180° with adjacent polygons having opposite phases.

Another pattern defined as L6 is created by removing all polygons from pattern L5 which have the same phase. In the preferred embodiment, all polygons having a phase of 0° are removed.

Pattern L6 corresponds to the areas of the mask that are to be etched to create a phase shift. A plurality of additional patterns generally corresponding to pattern L6 can be created having slightly enlarged polygons such that the patterns can be used in a voting technique for etching the phase shifted areas of the mask. In the preferred embodiment, two additional patterns, L7 and L8, are created such that the phase shifting areas are etched in three steps.

DETAILED DESCRIPTION OF THE PREFERRED EMBODIMENTS

The present invention provides a novel process for automatically generating the phase level patterns used in fabricating an alternating aperture phase shifting mask. The invention is best understood by reference to the accompanying drawing in which like parts are designated with like numerals.

Figure 1:
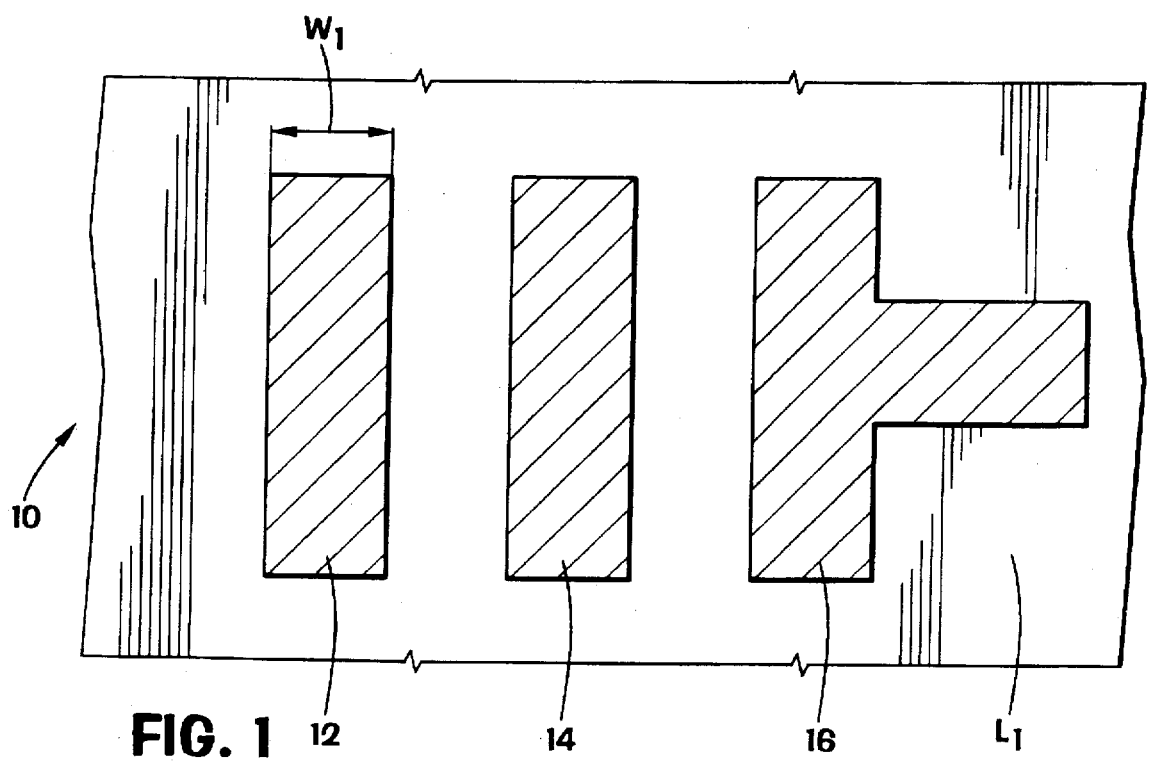
FIGS. 1-8 represent various patterns that are created while generating a mask design according to the present invention.

Referring first to FIG. 1, a portion of a mask design is illustrated. Pattern 10 is formed from polygons 12, 14 and 16 and is obtained by copying the chrome level design of a mask and filtering out or removing all polygons that have both X and Y dimensions greater than a predetermined value of W1. The value of W1 is determined by a designer, skilled in the art, and is a function of the exposure conditions that will be used with the mask. The polygons that have X and Y dimensions greater than W1 are large enough that they do not require any phase shifting technique to improve their printability. Pattern 10 is generally designated as level 1 or L1.

Figure 2:
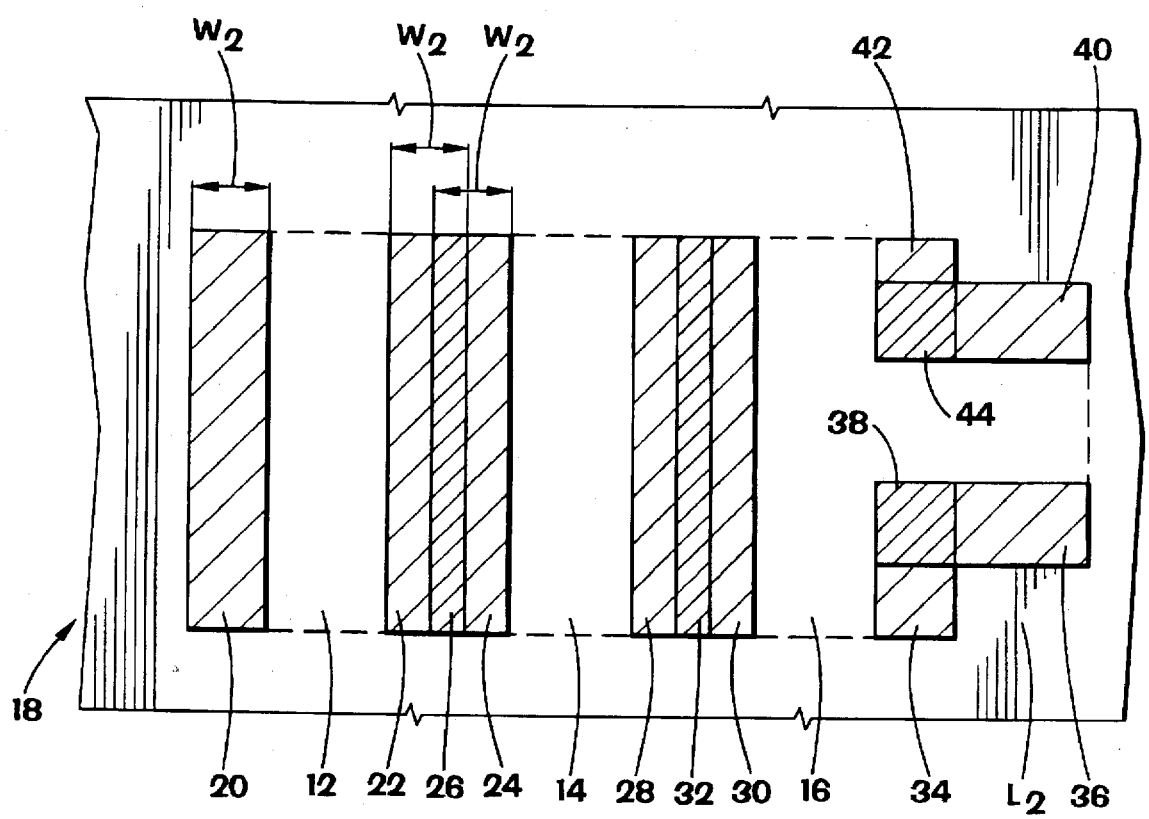

Referring next to FIG. 2, a second pattern referred to as level 2 or L2, generally designated at 18, is generated by creating a rectangle along the edge of each polygon of L1 if the edge is longer than W1. Rectangle 20 is created along one edge of polygon 12 and has a length coextensive with polygon 12. The width of rectangle 20 is set at a predetermined value W2 which is established by the designer and must be large enough to create a phase shift. It is a function of the light source that will be used with the mask and the exposure conditions. The determination of a suitable dimension is within the skill of experienced mask designers.

Rectangle 22 is formed along an opposite edge of polygon 12 and rectangle 24 is formed along an edge of polygon 14. Rectangles 22 and 24 have an overlapping potion 26. Rectangle 28 is formed along another edge of polygon 14 while rectangle 30 is formed along one edge of polygon 16. Rectangles 28 and 30 also have an overlapping portion 32. Rectangles 34, 36, 40 and 42 are formed along additional edges of polygon 16. Rectangles 34 and 36 have an overlapping portion 38 while rectangles 40 and 42 have an overlapping portion 44. All of the rectangles generated in level 2 have a width equal to W2.

Figure 3:
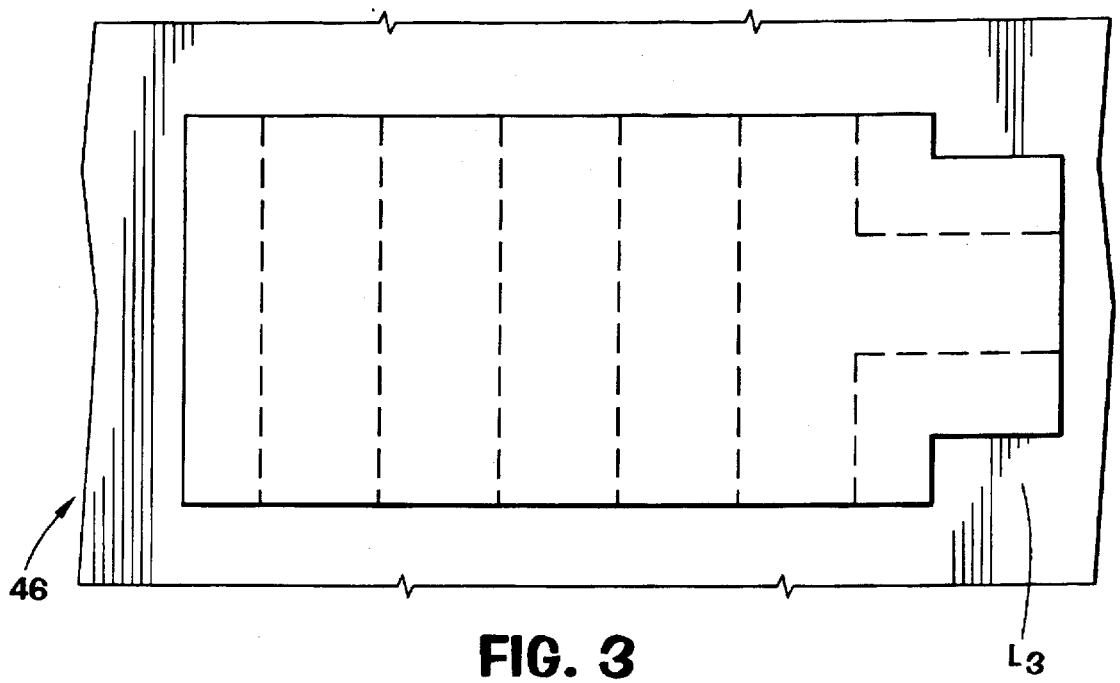

Referring next to FIG. 3, a pattern 46 is created by combining pattern 10 of level 1 with pattern 18 of level 2. Pattern 46 is generally referred to as level 3 or L3.

Figure 4:
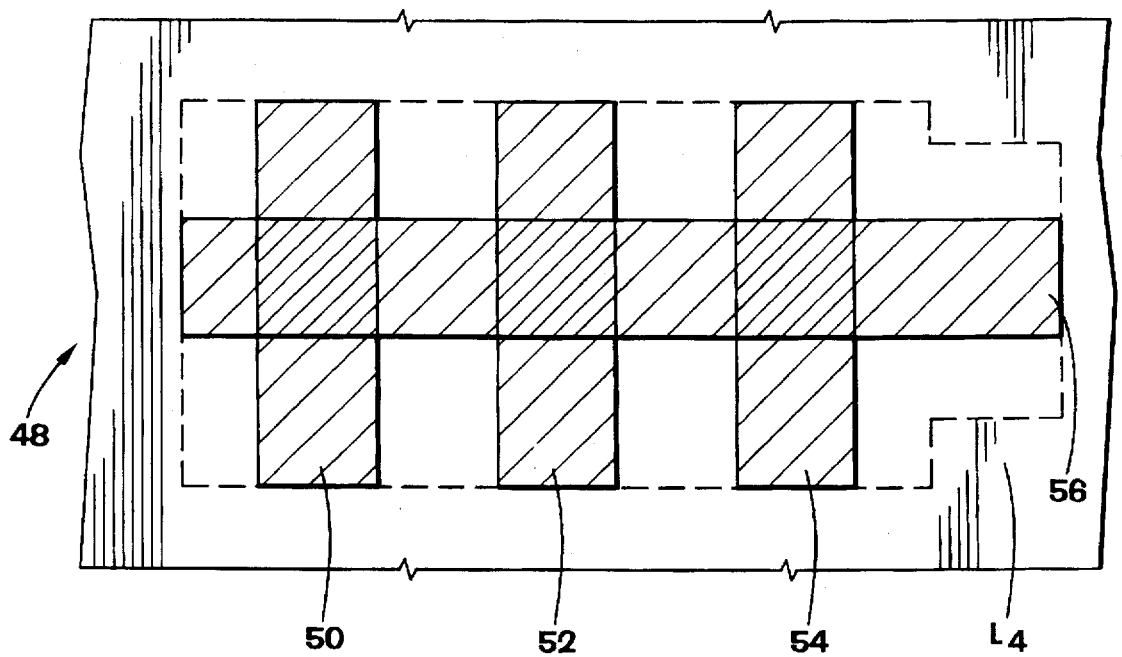

Referring next to FIG. 4, an additional pattern 48 is generated by creating rectangles within pattern 46 of level 3 beginning at each edge of pattern L1 having a width less than or equal to W1. The width of each rectangle is equal to the corresponding edge and the length extends from that edge to an opposite side of pattern 46 in L3. In the illustrated embodiment, rectangles 50, 52, 54 and 56 are created. Rectangles 50 and 52 generally correspond to polygons 12 and 14 of level 1. Rectangles 54 and 56 correspond to edges of polygon 16 of level 1. Pattern 48 is generally referred to as level 4 or L4.

Figure 5:
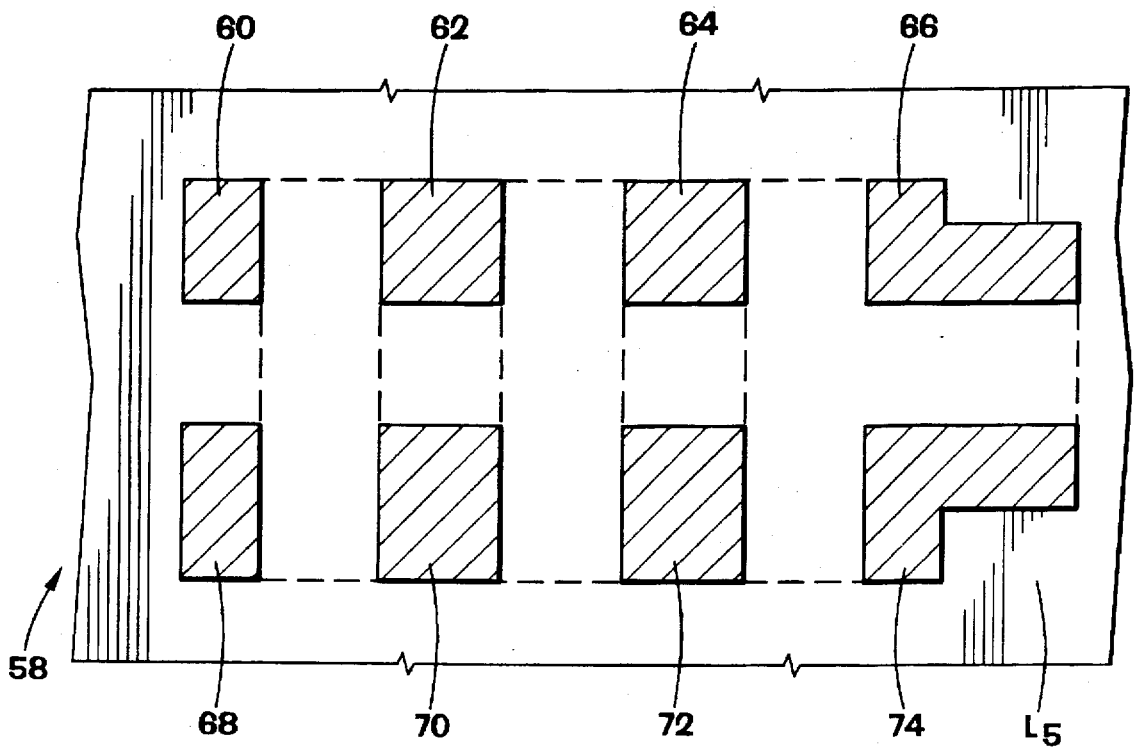

Referring next to FIG. 5, an additional pattern 58 is created by taking pattern 18 from level 2 and subtracting from pattern 18 any potions that overlap with pattern 48 of level 4. In the illustrated embodiment, pattern 58 is formed from at plurality of polygons 60, 62, 64, 66, 68, 70, 72 and 74. Pattern 58 is generally referred to as level 5 or L5. Each of the polygons of level 5 is then assigned a phase of 0° or 180° with adjacent polygons having opposite phases.

Figure 6:
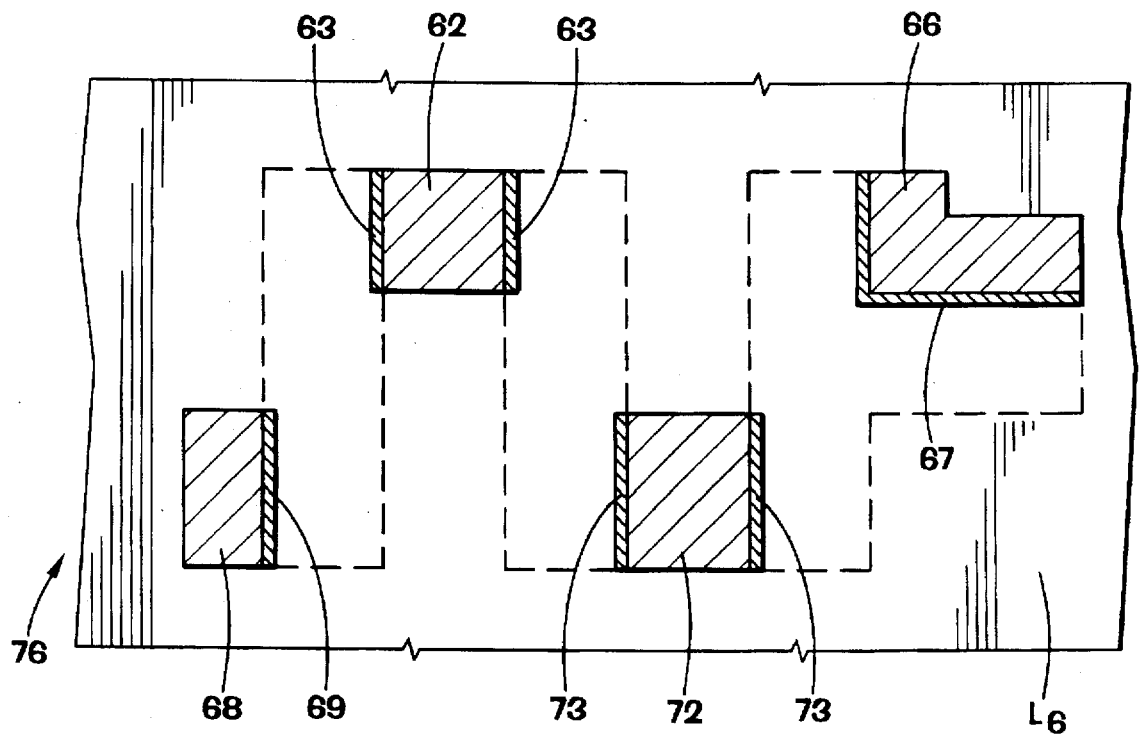

In the preferred embodiment, all of the polygons of level 5 having a phase of 0° are removed to create a pattern 76 illustrated in FIG. 6. Pattern 76 is formed from polygons 62, 66, 68 and 72. Pattern 76 is generally referred to as level 6 or L6.

Pattern 76 of level 6 defines the areas of the alternating phase shifting mask that will be etched to create a phase shift of 180°. The size of polygons 62, 66, 68 and 72 is increased by the areas 63, 67, 69 and 73 respectively so that they overlap the polygons of L1 which are shown with dotted lines. This overlap prevents the boundaries from being printed during fabrication. In a preferred embodiment using a 5X mask, the overlap is 0.3μ.

Figure 7:
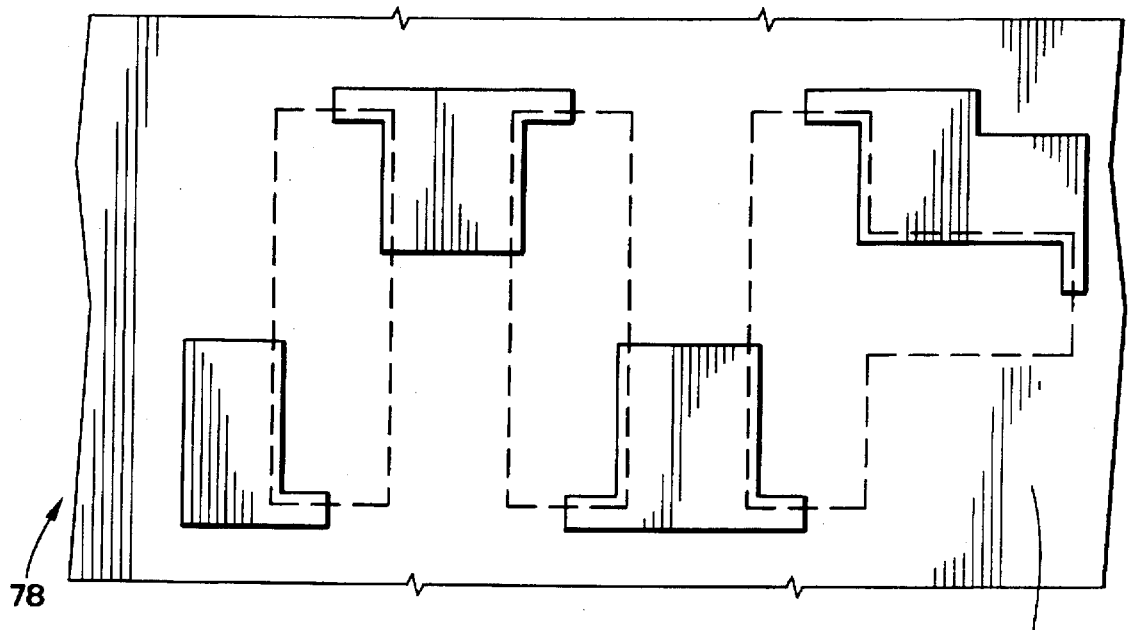
Figure 8:
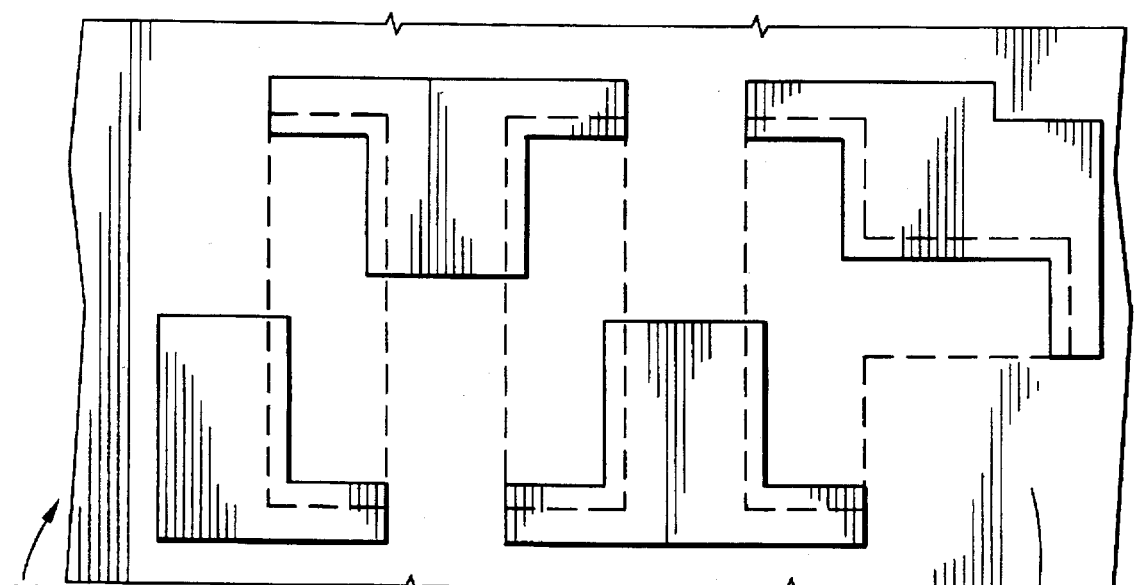

In the preferred embodiment, it is desirable to use a voting technique to etch the phase shifting areas in order to decrease the printability of any defects that are formed during the etching process. In the preferred embodiment, the phase shifting areas are etched in three steps. Accordingly, it is necessary to generate two additional patterns in addition to pattern 76 of level 6 for these additional etches. Patterns 78 and 80 illustrated in FIGS. 7 and 8, respectively, correspond to pattern 76 of level 6 but include enlarged and expanded polygons to take into account figment tolerances encountered in the fabrication process. Pattern 78 is generally referred to as level 7 or L7 and pattern 80 is generally referred to as level 8 or L8. While the preferred embodiment uses two additional layers, L7 and L8, it will be appreciated that any number of layers up to LN can be used.

While the invention has been described with respect to the presently preferred embodiments, it will be appreciated by those skilled in the art that modifications and changes can be made to the process of the present invention without departing from its spirit or essential characteristics. For example, the number of additional layers corresponding to level 6 can be increased or decreased. Accordingly, all the modifications or changes which come within the meaning and range of equivalency of the claims are to be embraced within their scope.

What is claimed is:

1. A process for generating a phase level of an alternating aperture phase shifting mask comprising:

obtaining a pattern corresponding to a chrome level design of a mask;

removing from said pattern all polygons having both X and Y dimensions greater than a predetermined value W1 to create a pattern defined as L1;

creating a rectangle along the edge of each polygon in pattern L1 if said edge is greater than W1, said rectangles having a predetermined width W2, said rectangles forming a pattern defined as L2;

merging pattern L1 with pattern L2 to form a pattern defined as L3;

creating a pattern formed by rectangles within pattern L3 beginning at each edge of pattern L1 having a width less than or equal to W1, said rectangles having a width equal to a corresponding edge and a length extending from said edge to an opposite side of pattern L3, said rectangles forming a pattern defined as L1;

creating a pattern defined as L5 by subtracting overlapping portions of pattern L4 from pattern L2;

assigning a phase of 0° or 180° to each polygon of pattern L5 with adjacent polygons having opposite phases; and creating a pattern defined as L6 by removing all polygons having the same phase from pattern L5.

2. A process for generating a phase level of an alternating aperture phase shifting mask as defined in claim 1 further comprising creating additional patterns defined as L7–LN corresponding to pattern L6 but having enlarged polygons such that said pattern L6 can be formed in a mask using a voting technique with patterns L6–LN.

3. A process for generating a phase level of an alternating aperture phase shifting mask as defined in claim 2 wherein said additional patterns comprise patterns L7 and L8.

4. A process for generating a phase level of an alternating aperture phase shifting mask as defined in claim 1 wherein said pattern L6 is created by removing all polygons assigned a phase of zero degrees.

5. An alternating aperture phase shifting mask design generated by the process of claim 1.

6. A process for generating a phase level of an alternating aperture phase shifting mask comprising:

obtaining a pattern corresponding to a chrome level design of a mask;

removing from said pattern all polygons having both X and Y dimensions greater than a predetermined value W1 to create a pattern defined as L1;

creating a rectangle along the edge of each polygon in pattern L1 if said edge is greater than W1, said rectangles having a predetermined width W2, said rectangles forming a pattern defined as L2;

merging pattern L1 with pattern L2 to form a pattern defined as L3;

creating a pattern formed by rectangles within pattern L3 beginning at each edge of pattern L1 having a width less than or equal to W1, said rectangles having a width equal to a corresponding edge and a length extending from said edge to an opposite side of pattern L3, said rectangles forming a pattern defined as L4;

creating a pattern defined as L5 by subtracting overlapping portions of pattern L4 from pattern L2;

assigning a phase of 0° or 180° to each polygon of pattern L5 with adjacent polygons having opposite phases;

creating a pattern defined as L6 by removing all polygons having a phase of 0° from pattern L5; and creating additional patterns defined as L5–LN corresponding to pattern L6 but having enlarged polygons such that said pattern L6 can be formed in a mask using a voting technique with patterns L6–LN.

7. A process for generating a phase level of an alternating aperture phase shifting mask as defined in claim 6 wherein said additional patterns comprise patterns L7 and L8.

8. An alternating aperture phase shifting mask design generated by the process of claim 6.

* * * * *

UNITED STATES PATENT AND TRADEMARK OFFICE
CERTIFICATE OF CORRECTION

PATENT NO.    :   5,686,208
DATED         :   November 11, 1997
INVENTOR(S)   :   Le et al.

It is certified that error appears in the above-identified patent and that said Letters Patent is hereby corrected as shown below:

Column 1, line 62, potions should be portions.

Column 1, line 64, mount should be amount.

Column 3, line 49, potion should be portion.

Column 4, line 8, potions should be portions.

Column 4, line 35 figment should be alignment.

Signed and Sealed this

Tenth Day of March, 1998

Attest:

BRUCE LEHMAN

Attesting Officer

Commissioner of Patents and Trademarks